US011175329B2

United States Patent
Blumschein et al.

(10) Patent No.: US 11,175,329 B2
(45) Date of Patent: Nov. 16, 2021

(54) METHOD AND PROTECTION DEVICE FOR GENERATING AN ERROR SIGNAL INDICATING AN ERROR TYPE OF AN ERROR IN A MULTI-PHASE ELECTRICAL ENERGY SUPPLY NETWORK

(71) Applicant: Siemens Aktiengesellschaft, Munich (DE)

(72) Inventors: Joerg Blumschein, Berlin (DE); Cezary Dzienis, Dallgow-Doeberitz (DE); Tomasz Dawid Lindel, Berlin (DE); Yilmaz Yelgin, Berlin (DE)

(73) Assignee: Siemens Aktiengesellschaft, Munich (DE)

( * ) Notice: Subject to any disclaimer, the term of this patent is extended or adjusted under 35 U.S.C. 154(b) by 391 days.

(21) Appl. No.: 15/533,053

(22) PCT Filed: Dec. 12, 2014

(86) PCT No.: PCT/EP2014/077629
§ 371 (c)(1),
(2) Date: Jun. 5, 2017

(87) PCT Pub. No.: WO2016/091334
PCT Pub. Date: Jun. 16, 2016

(65) Prior Publication Data
US 2017/0336464 A1     Nov. 23, 2017

(51) Int. Cl.
*G01R 31/42*      (2006.01)
*G01R 31/08*      (2020.01)
(Continued)

(52) U.S. Cl.
CPC .......... *G01R 31/086* (2013.01); *G01R 27/08* (2013.01); *G01R 31/42* (2013.01); *H02H 3/40* (2013.01); *H02H 7/26* (2013.01)

(58) Field of Classification Search
CPC ............ H02H 3/40; H02H 7/26; H02H 3/162; H02H 1/04; G01R 27/08; G01R 31/42;
(Continued)

(56) References Cited

U.S. PATENT DOCUMENTS 4,179,651 A * 12/1979 Vitins ..................... H02H 7/265
324/543
4,812,995 A * 3/1989 Girgis ...................... H02H 3/40
324/512

(Continued)

FOREIGN PATENT DOCUMENTS

EP      1207610 A2    5/2002
EP      2113778 A1    4/2009
(Continued)

*Primary Examiner* — Lee E Rodak
*Assistant Examiner* — Brent J Andrews
(74) *Attorney, Agent, or Firm* — Laurence A. Greenberg; Werner H. Stemer; Ralph E. Locher

(57) ABSTRACT

A method for generating an error signal indicating an error type of an error in a multi-phase electrical energy supply network. Measured values describe a current operating state of the network. The measured values are transmitted to a protection device. An evaluating device evaluates every possible loop of the network that can be affected with respect to the recognition of the error type of an error, by using the measured values. In order to be able to more reliably recognize the error type even under different network conditions, the measured values and/or values derived from the measured values are evaluated using at least two different protection criteria, for every possible loop. Each of the protection criteria is suitable for indicating an error type of an error present in the evaluated loop, and the error signal is generated in consideration of all available evaluation results of the protection criteria.

16 Claims, 12 Drawing Sheets

(51) Int. Cl.
*H02H 7/26* (2006.01)
*H02H 3/40* (2006.01)
*G01R 27/08* (2006.01)

(58) Field of Classification Search
CPC .. G01R 31/086; G01R 31/088; G01R 15/142; G01R 15/20; G01R 29/18
See application file for complete search history.

(56) References Cited

U.S. PATENT DOCUMENTS

| | | | |
|---|---|---|---|
| 6,525,543 B1* | 2/2003 | Roberts | H02H 3/286 324/522 |
| 2011/0163777 A1* | 7/2011 | Yelgin | H02H 3/40 324/764.01 |
| 2012/0166141 A1* | 6/2012 | Watkins | G01R 19/2513 702/183 |
| 2013/0221976 A1* | 8/2013 | Blumschein | G01R 31/088 324/509 |

FOREIGN PATENT DOCUMENTS

| | | |
|---|---|---|
| EP | 2304857 B1 | 9/2013 |
| RU | 2447454 C1 | 4/2012 |
| WO | 2008034936 A1 | 3/2008 |

* cited by examiner

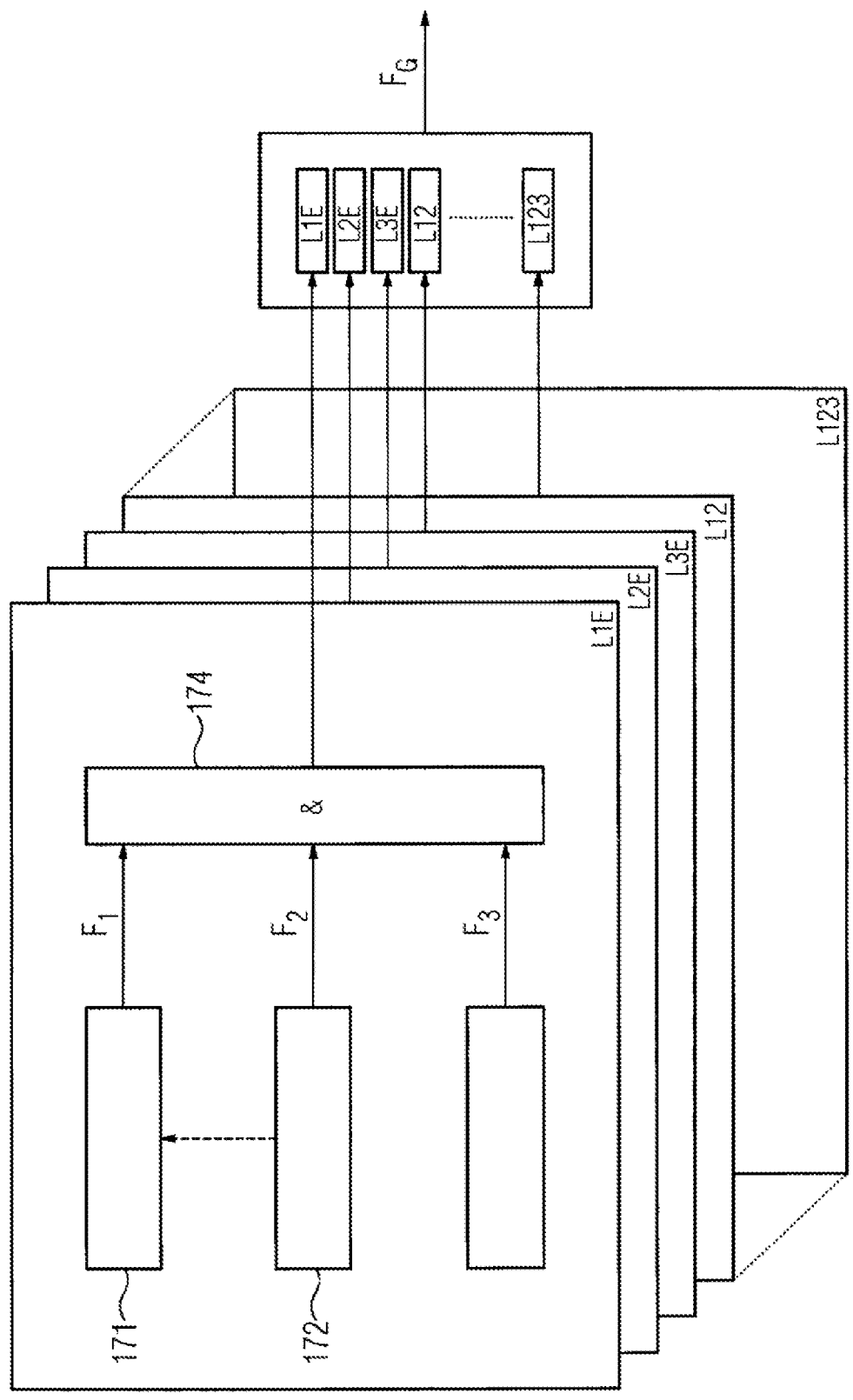

METHOD AND PROTECTION DEVICE FOR GENERATING AN ERROR SIGNAL INDICATING AN ERROR TYPE OF AN ERROR IN A MULTI-PHASE ELECTRICAL ENERGY SUPPLY NETWORK

BACKGROUND OF THE INVENTION

Field of the Invention

The invention relates to a method for generating an error signal indicating an error type of an error in a multi-phase electrical energy supply network, wherein measured values are detected at at least one measurement point in the energy supply network which describe a current operating state of the energy supply network, the measured values are transmitted to a protection device, each potential loop of the energy supply network that can be affected by an error is evaluated with respect to the recognition of the error type of an error, by means of an evaluation device of the protection device, using the measured values, and, if an error is present, the error signal is generated. The invention further relates to a protection device for generating an error signal indicating an error type of an error in a multi-phase electrical energy supply network, having an evaluation device, for executing said method.

For the monitoring of primary components, e.g. lines, in electrical energy supply networks, "protection devices" are employed for the detection of unreliable operating states on the respectively monitored primary components which can be caused, for example, by short-circuits or ground faults, and for automatic tripping. To this end, at one or more measurement points on the energy supply network, the protection device customarily detects measured values, for example measured current and/or voltage values, which characterize the operating state of primary components. For the execution of its protective function, the protection device then evaluates the measured values by the application of a "protection algorithm", i.e. a calculation and/or combinational logic instruction for the evaluation of the measured values detected and, depending upon the result of the evaluation, generates a trip signal which, where applicable, causes a circuit-breaker which is connected to the protection device to open its switching contacts, thus isolating the defective line from the remainder of the energy supply network.

An example of a commonly-applied protection algorithm for the monitoring of lines in electrical energy supply networks operates by the "distance protection" method, whereby impedance values in a complex plane are calculated from measured current and voltage values, and it is determined whether the impedance values lie within a predefined trip range—also described as a trip polygon. If impedance values lie within this predefined trip range, the protection device confirms an unacceptable operating state on the line of the electrical energy supply network which is monitored by the latter, and transmits a trip signal to one or more circuit-breakers which delimit the line, thus isolating the defective line from the remainder of the energy supply network.

In addition to the issue of whether an error has occurred at all, the identification of an error type of an error is also an important aspect related to error detection in energy supply networks. An error type characterizes the error present more specifically and indicates, for example, in which potential error loop of the multi-phase energy supply network and/or in which direction, considered in relation to the measurement point, the error is located. In a three-phase energy supply network having three conductors (conductor 1, conductor 2, conductor 3), and depending upon the conductors involved in the error, seven potential fault loops exist; the following list sets out in each case the potential conductors involved in an error, together with the respective abbreviations employed in the present document for the error loops concerned:

Single-pole error: conductor 1—ground L1E;
Single-pole error: conductor 2—ground L2E;
Single-pole error: conductor 3—ground L3E;
2-pole error: conductor 1—conductor 2 L12;
2-pole error: conductor 2—conductor 3 L23;
2-pole error: conductor 3—conductor 1 L31;
3-pole error: conductor 1—conductor 2—conductor 3 L123.

Depending upon the error type detected, an error present on the energy supply network can be selectively disconnected, i.e. on the conductor affected by the error and/or in the corresponding direction, considered from the measurement point, such that the continuing operation of other parts of the network is possible.

From European patent document EP 2304857 B1, identification of the error type of an error, in the form of a defective loop, by the consideration of an "impedance change rate" is known. Those loops which show the lowest impedance change rate are selected as defective loops, and an error signal is generated which indicates the error type (in this case: error present in the loops identified). According to the known method, the error signal is employed for the release of the blocking of a protection zone, which has previously been blocked on the grounds of an existing power swing, in order to permit the disconnection of the error.

In the known method, the evaluation of the defective loop relies exclusively upon the impedance change range. This entails the hazard that, in the case of errors in which the impedance change rate does not constitute a sufficient protection criterion, an incorrect decision will be implemented, such that the disconnection of an actually error-free network section will inadvertently be tripped, or the disconnection of a defective network section which is actually required will inadvertently be omitted.

As a result of recent developments in the field of energy supply networks, for example the deregulation of power generation markets and the resulting fragmentation of traditional power transmission directions in the energy supply network, associated with the decentralized infeed of power, increasingly stringent requirements are imposed upon protection devices in energy supply networks, in respect of their reliability and selectivity, such that a flexible and adaptive facility is required for the adjustment of the respective protection criteria applied to detect an error type.

Summary of the Invention

On the basis of a method and a protection device of the aforementioned type, the object of the invention is thus the proposal of a method and a protection device for the reliable detection of an error type, even under different network conditions.

In respect of the method according to the invention, this object is fulfilled by a method of the aforementioned type in which, for each potential loop, the measured values and/or values derived from the measured values are evaluated by the application of at least two different protection criteria, wherein each of the protection criteria is appropriate for the identification of an error type of an error present in the respective loop thus evaluated, and an error signal is generated in consideration of all available results for the evaluation of protection criteria.

In the method according to the invention, in an advantageous manner, the decision regarding an error type is not only based upon a single protection criterion, but upon the application of a plurality of protection criteria (at least two) which are, per se, each appropriate for the identification of an error type in the respective loop evaluated. Different protection criteria are classified as criteria which are suitable for the determination of the same result by the application of different methods. The different methods can be based upon the application of different measured values (e.g. current, voltage, etc.) and/or of values derived therefrom (e.g. impedance, active power, reactive power and effective values, indices, RMS values, average values for current, voltage, etc.) and/or upon the application of different algorithms. The evaluation is executed for all potential error loops (L1E, L2E, L3E, L12, L23, L31, L123), and the error signal is generated in consideration of all available results for the error criteria reviewed. As the evaluation is executed by the application of at least two protection criteria, and the results for all protection criteria are considered, a result with significantly higher reliability is achieved, in comparison with the review of a single criterion only; if one of the protection criteria does not permit a clear conclusion to be reached, there is an option for this uncertainty to be offset by a further protection criterion, the review of which, for example, involves different measured values.

The method according to the invention can, moreover, be adapted to different network situations in a highly flexible manner, as the protection criteria employed for the detection of the error type can be selected according to, for example, the existing topology and/or voltage level.

The error signal can, for example, be used to trip a selective switching operation on a specific loop, in order to disconnect faults detected on said loop.

According to an advantageous form of embodiment of the method according to the invention, it is provided that the protection criteria can be evaluated in a mutually parallel manner.

In this case, a "parallel" evaluation can signify, for example, the execution of protection criteria which is run simultaneously on different (physical and/or virtual) processors or processor cores, or in a calculation engine with hardware-related programming (e.g. ASIC, FPGA). However, a parallel evaluation can also be classified as a sequentially-executed run of protection criteria (e.g. on one or more processors or processor cores), provided that the results of all protection criteria are incorporated, in parallel, into the final evaluation (conversely, for example, to sequential processing, in which the result of a first execution of a protection criterion is incorporated in the execution of the next protection criterion).

By this form of embodiment, it can be achieved that, in practice, all protection criteria are involved in the generation of the error signal, such that reliability in the generation of the error signal is further enhanced.

According to a further form of embodiment of the method according to the invention, it can be provided that the result of the evaluation of the respective protection criterion is multiplied by a weighting factor to form a weighted result and, for each potential loop, all the weighted results are combined to form an overall result.

The prioritization of the individual protection criteria applied can thus be advantageously achieved. It can occur that a specific protection criterion, in the majority of cases of error, can identify the correct error type with comparatively high reliability, whereas another protection criterion can only deliver a clear result in specific borderline cases. In the form of embodiment described, a corresponding overweighting of the first protection criterion can be applied such at, as a priority, the decision in respect of error type is dependent upon this protection criterion. Wherein, ultimately, the overall result for each potential loop is comprised of an appropriate combination, e.g. by addition, of all the weighted results, it can be achieved that only one result (the overall result) is generated per loop, and that this result—where applicable, with the relevant weighting— incorporates the consideration of all the protection criteria applied for the loop.

According to a further advantageous form of embodiment, it is moreover provided, in this regard, that the error signal is generated in consideration of the overall results for all the loops evaluated.

It is thus ensured that the error signal considers all the overall results for the individual potential loops, and that the error type is not defined on the basis of the result for one loop only, or a limited number of loops. On the grounds that the individual overall results are, in turn, constituted in consideration of all the protection criteria evaluated for the relevant loop, it can moreover be ensured that the all the individual protection criteria, with their respective weighting, are involved in the constitution of the error signal. For example, for the "defective loop" error type, in the constitution of the error signal, the loop having the overall result with the highest value can be selected.

Specifically, in this regard, it can moreover be ensured that, for each potential loop, the weighting factors applied for all the protection criteria evaluated are selected such that the sum thereof is equal to 1.

Moreover, in respect of the weighting factors, it can be provided that the magnitude of the respective weighting factors is selected in accordance with the respective configuration of the energy supply network.

An adaptive behavior of the protection device for the execution of the method can thus be achieved, wherein a response is generated to different network configurations by the corresponding adjustment of weighting factors, and thus the prioritization of individual protection criteria. For example, it may be rational, in case of a substantial infeed in the vicinity of the measurement point, for protection criteria which employ measured currents and/or values derived therefrom to be more heavily weighted, in relation to voltage-based protection criteria whereas, in case of a low infeed, voltage-based protection criteria are weighted more heavily. This selection of values for weighting factors can be applied on a one-off basis (e.g. upon the commissioning of the protection device), with respect to predefined network configurations and/or parameters, or can be executed continuously. By continuous adjustment, for example, highly-variable infeed and load conditions in the vicinity of the measurement point can be dynamically incorporated into the prioritization of protection criteria.

In a further advantageous form of embodiment of the method according to the invention, it is provided that the error signal is only generated if the overall result for at least one potential loop exceeds an error detection threshold value.

The risk of spurious tripping is hereby significantly reduced, in that not every increase in an overall result for a loop immediately leads to the generation of the error signal. Only if the significance of an increase in the overall result for at least one loop is such that an error must be assumed will the error signal be generated. The error detection threshold value can assume a predefined fixed value. Alternatively, the error detection threshold value can also be constituted dynamically and, for example, can be determined by relative comparison with the overall results for all loops, or in consideration of the margin between the overall results for one loop and the overall results for the remaining loops.

In a further advantageous embodiment of the method according to the invention, it is provided that the respective result of evaluation of the respective protection criterion is constituted in the form of a protection criteria-specific probability value, which indicates the probability, according to the protection criteria evaluated, of the presence of an error of the relevant error type, and the respective overall result is constituted in the form of a loop-specific probability value, which indicates the probability of the presence of an error of the relevant error type in the loop considered.

This form of embodiment has the advantage, in that all the overall results for all loops are mutually comparable. A probability value always assumes a value between 0 and 1, such that an overall result which considers the weighted protection criteria-specific probability values can itself be expressed as a probability value. By the application of probability values, the superior incorporation of all results for individual protection criteria in the overall result can moreover be achieved, wherein a protection criterion not only provides a binary indication of the presence or otherwise of a specific error type, but also indicates the current probability of the presence of said error type. By the combination of all protection criteria-specific probability values, the loop-specific probability value can be constituted with greater transparency than that associated with a purely binary consideration. For example, it be provided that the error signal is determined by the comparison of all the loop-specific probability values for that loop, the loop-specific probability value of which is the highest, and the corresponding error type for this loop is selected thereafter.

In a further advantageous form of embodiment of the method according to the invention, a respective protection criterion is only evaluated if all the measured values and/or derived values required for the evaluation thereof are available.

Accordingly, those protection criteria which—for example, on the grounds of absent measured values and/or derived values—are not applicable can be temporarily excluded from the evaluation.

Regarding the constitution of weighting factors, it can further be provided that a respective protection criterion is only evaluated if all the measured values and/or derived values required for the evaluation thereof are available; the overall result is only constituted by the application of the weighted results of those protection criteria which have been evaluated.

In this case, it can be provided that the weighting factors of the remaining protection criteria, which have been evaluated in practice, are adjusted in order to offset the missing evaluation of a protection criterion which has been excluded on the grounds of absent measured values and/or derived values. In such a case, the weighting of the excluded protection criterion is distributed between the protection criteria applied, in accordance with the weighting of the latter.

For example, it can be provided that, as an error type, the error signal indicates the direction of an error.

Protection criteria which are appropriate for the detection of the "error direction" error type include, for example, those listed below:

Actual present short-circuit voltage: this protection criterion defines the relationship of the present voltage index to the present current index. The calculated impedance gives an indication of the error direction.

Actual saved short-circuit voltage: this protection criterion defines the relationship of the saved voltage index to the present current index. The voltage index, adjusted to the present phase angle, is applied for this purpose. The calculated impedance gives an indication of the error direction. This is preferably applied in series-compensated networks.

Externally-generated present short-circuit voltage: this protection criterion defines the relationship of the externally-generated present fault voltage index, rotated through 90°, to the present current index. The calculated impedance gives an indication of the error direction. The method only works for single-pole and two-pole errors, with no ground fault.

Externally generated saved short-circuit voltage: this protection criterion defines the relationship of the externally-generated saved fault voltage index, rotated through 90°, to the present current index. The calculated impedance gives an indication of the error direction. The method only works for single-pole and two-pole errors, with no ground fault.

Delta variable criterion: directional determination by delta variables operates with static or dynamic delta variables. In directional determination with static delta variables, delta indices of current and voltage are used. Delta indices of current and voltage are calculated from the difference between the present measured index and the index saved prior to the start of the error. The ratio of the delta voltage index to the delta current index gives an indication of the fault direction. In directional determination with dynamic delta variables, sampled delta values of current and voltage are used. Sampled delta values of current and voltage are calculated from the difference between the present measured sample value and the sample value recorded one network cycle previously. The product of the delta voltage and delta current is integrated. The result of integration gives an indication of the error direction.

Symmetrical component criterion: directional determination is based upon symmetrical components. In directional determination with zero phase-sequence variables, zero phase-sequence impedance is determined from current and voltage indices for the zero phase-sequence system. The calculated impedance gives an indication of the error direction. The method only works for errors involving a ground fault. In directional determination with negative phase-sequence variables, negative phase-sequence impedance is determined from voltage and current indices for the negative phase-sequence system. The calculated impedance gives an indication of the error direction. This is preferably applied for short-circuits during network cycles. The impedance will only apply to asymmetrical short-circuits.

Delta positive-sequence variable criterion: in directional determination with delta positive-sequence variables, the ratio of the delta voltage index to the delta current index of the positive-sequence system is defined. The calculated impedance gives an indication of the error direction.

The error direction, considered from the respective measurement point, can be described as "forward", "backward" or "non-directional". A non-directional orientation gives no positive indication of a forward or backward error.

It can also be provided that the error signal is indicated as a defective loop error type.

Protection criteria which are appropriate for the detection of the "defective loop" error type include, for example, those listed hereinafter.

- Current level criterion: this protection criterion is based upon the assumption that, in the event of an error, the current in the defective loop will rise. For example, the ratio of the RMS current value to the rated current value thus indicates the defective loop.
- Voltage level criterion: this protection criterion is based upon the assumption that, in the event of a fault, the voltage in the defective loop will collapse. For example, the ratio of the RMS voltage value to the rated voltage thus indicates the defective loop.
- Delta current level criterion: this protection criterion involves "delta variables" for currents. Large delta variables indicate significant steps in the current characteristic of the loop considered, and thus indicate a potential error. The following delta variables e.g. can be constituted: the difference between the present RMS current value and a previously saved (e.g. by one cycle) RMS current value; the difference between the present instantaneous current value and a saved instantaneous current value which precedes the latter by a nominal cycle; the difference between instantaneous current index values and a saved current index value. The magnitude of the respectively calculated delta variables provides an indication of the defective loop.
- Delta voltage level criterion: this protection criterion involves "delta variables" for voltages. Large delta variables indicate significant steps in the voltage characteristic of the loop considered, and thus indicate a potential error. The following delta variables e.g. can be constituted: the difference between the present RMS voltage value and a previously saved (e.g. by one cycle) RMS voltage value; the difference between the present instantaneous voltage value and a saved instantaneous voltage value which precedes the latter by a nominal cycle; the difference between instantaneous voltage index values and a saved voltage index value. The magnitude of the calculated delta variables provides an indication of the defective loop.
- Impedance criterion: this protection criterion involves the calculation of impedances for all error loops. The ratio of the lowest impedance value to the respectively calculated loop impedance provides an indication of the defective loop.
- Symmetrical component criterion: this protection criterion is based upon symmetrical components. The relationship between the zero, negative and positive phase-sequence indices for current or voltage provide an indication of the defective loop.
- Step detection: this protection criterion is a logical criterion, which employs current and voltage steps as input variables. By the logical association of current and voltage steps observed, the defective loop can be identified.

In the case of the "defective loop" error type, the evaluation of protection criteria for a specific loop—where applicable, by further comparison with evaluations for the remaining loops—provides a direct indication of the error type, i.e. the decision to the effect that the loop concerned is affected by an error or otherwise. Additional subdivision of the error type, as in the case of the error direction, is not required here.

In a further advantageous form of embodiment of the method according to the invention, it is moreover provided that a first error signal is generated which, as an error type, indicates the direction of an error, a second error signal is generated which, as an error type, indicates the defective loop, and an overall error signal is generated in consideration of the first and second error signals.

In this form of embodiment, the method according to the invention described above, or one of its forms of embodiment, is applied once for the constitution of an error signal pertaining to the direction of an error, and once for the constitution of an error signal pertaining to the detection of a defective loop. By a combination of the two error signals, an overall error signal can be generated, which firstly indicates the defective loop, and secondly indicates the direction in which the error is located in said loop.

In this connection, according to a further advantageous form of embodiment of the method according to the invention, it can be provided that, using the evaluation unit, it can also be verified whether an error is present in a protection zone of the energy supply network which is directly monitored by the protection device, and an error zone signal is generated if an error is present in the protection zone, and the overall error signal is also generated in consideration of the error zone signal.

In this manner, the decision as to whether any fault is present at all in the protection zone of the protection device (internal fault) or is present outside the protection zone of the protection device (external fault) can also be incorporated into the constitution of the overall fault signal. The definition of the protection zone can proceed, for example, by the aforementioned distance protection method, by the application of the impedance determined from the current and voltage at the measurement point. By the consideration of all three factors—the affected protection zone, in conjunction with the error types identified in respect of direction and the affected loop—the error can be selectively identified and disconnected.

The aforementioned object is also fulfilled by a protection device for generating an error signal indicating an error type of an error in a multi-phase electrical energy supply network, having a measured value detection device for the detection of measured values detected at at least one measurement point in the energy supply network, which describe a current operating state of the energy supply network, and an evaluation device which is designed, by the use of measured values, to evaluate each potential loop of the energy supply network that can be affected by an error, with respect to the detection of the error type of an error and, in the event of the presence of an error, to generate the error signal.

According to the invention, it is provided that the evaluation device is designed for the execution of a method as claimed.

All preceding and subsequent statements regarding the method according to the invention provided herein apply correspondingly to the protection device according to the invention, and vice versa—specifically, the protection device according to the invention is designed to execute any form of embodiment of the method according to the invention, or a combination of any forms of embodiment thereof. Likewise, regarding the advantages of the protection device according to the invention, reference shall be made to the advantages of the method according to the invention.

The invention is described in greater detail hereinafter, with reference to an exemplary embodiment. The specific configuration of the exemplary embodiment is not to be considered by way of restriction of the general configuration of the method according to the invention and the protection device according to the invention; individual characteristics of the configuration of the exemplary embodiment, together with the aforementioned characteristics, can be freely and mutually combined in an arbitrary manner.

BRIEF DESCRIPTION OF THE SEVERAL VIEWS OF THE DRAWING

FIG. 17 shows a schematic sequence block circuit diagram for the clarification of the generation of an overall error signal in consideration of an individual error signal.

DESCRIPTION OF THE INVENTION

Figure 1:
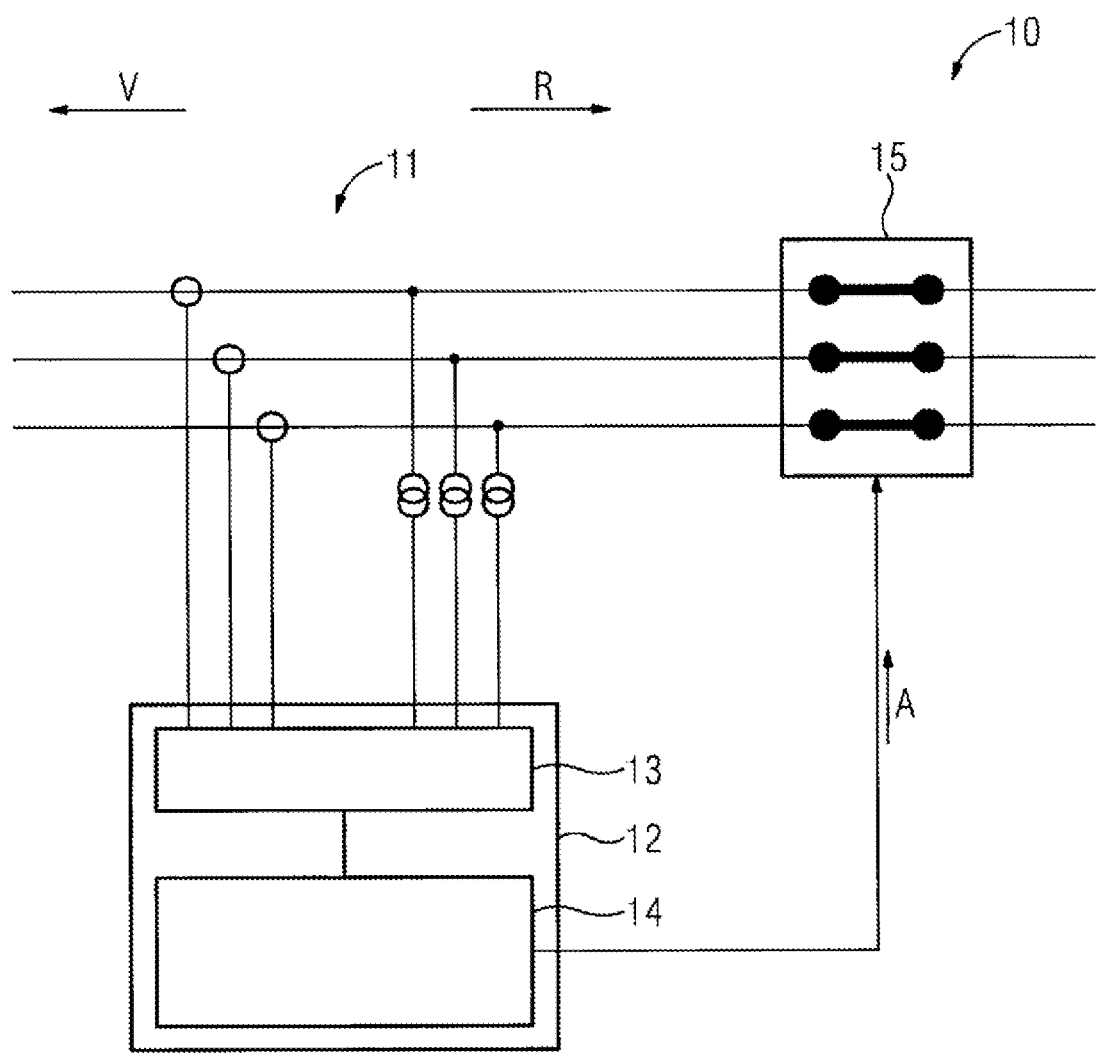
FIG. 1 shows a schematic view of part of an electrical energy supply network monitored by a protection device.

FIG. 1 shows a schematic view of a network section of an electrical energy supply network, which is not otherwise represented in greater detail. The network section 10 represented is, for example, an energy supply line, which can be configured e.g. as an overhead line or as an underground cable. At a measurement point 11, measured values which indicate the state of the energy supply network at the measurement point 11 are detected using a measuring transducer, which is only schematically represented. The measured values can be e.g. electric currents and/or voltages. The measured values detected are routed to a protection device 12, for example a distance protection device, where they are detected by means of a measured value detection device 13. Pre-processing is executed in the measured value detection device, e.g. analog-digital conversion, filtering, calculation of derived values (average values, RMS values, effective values, index values, symmetrical components, impedances, power values, etc.). The pre-processed measured values and, where applicable, derived values are transmitted to an evaluation device 14 which executes an evaluation of potential errors present in a protection zone of the protection device 12 with respect to the measured values transmitted and derived values. For example, a distance protection algorithm which is known per se can be applied, by means of which, using the complex impedance value calculated from current indices and voltage indices, the presence of errors can be established. Firstly, it must be determined whether the error lies inside or outside a monitored protection zone of the protection device. Only in the case of errors sited within the protection zone is the protection device itself primarily responsible for fault identification. In a distance protection device, the decision as to whether the error lies within the protection zone is customarily based upon the position of the impedance value in the complex plane of impedance levels. Additionally, error types of the error, specifically the direction (forward direction: V; backward direction: R) of the error, considered from the measurement point, and the loops (L1E, L2E, L3E, L12, L23, L34, L123) affected by the error are determined. If the protection device 12, with reference to all the requisite information, confirms the presence of an error within the protection zone, in the forward direction and in a specific loop, it can then, by means of a trip signal A, initiate the selective opening of the switching contacts on a circuit-breaker 15, in order to isolate the defective conductor from the remainder of the energy supply network.

The measured value detection device 13 and the evaluation device 14 do not need to be configured as separate devices, but can also constitute an integrated device. The functions of the measured value detection device 13 and the evaluation device 14 can be established by means of hardware-related programming (e.g. ASIC, FPGA), by the software-related programming of a processor (e.g. a microprocessor, CPU, digital signal processor (DSP)), or a combination thereof.

Figure 2:
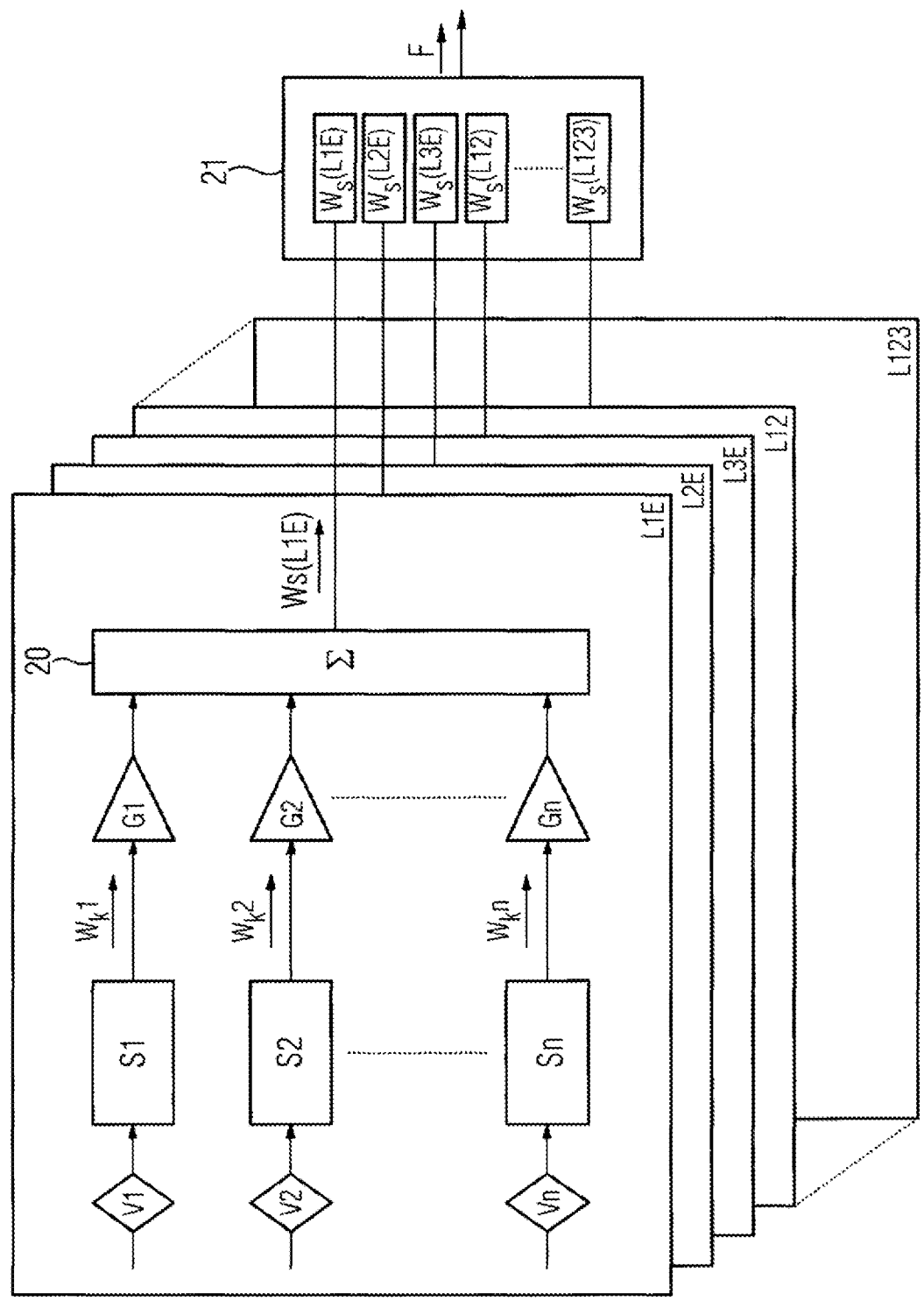
FIG. 2 shows a schematic sequence block circuit diagram for the clarification of a method for the generation of an error signal indicating the error type of an error.

In the form of a sequence block circuit diagram, FIG. 2 shows an exemplary function executed by the evaluation unit 14 for the determination of the error type of an error, and for the generation of an error signal F which indicates the error type thus determined. Detection of the error type is executed for all the potential loops in which an error can occur, i.e. L1E, L2E, L3E, L12, L23, L31, L123. The following comments relate primarily to the potential loop L1E.

Conversely to previous approaches, for the determination of the error type of an error according to the sequence block circuit diagram represented in FIG. 2, a plurality of different protection criteria S1, S2 . . . Sn are mutually evaluated in parallel. Examples of individual protection criteria will be described subsequently. Each protection criterion is, in itself, independently capable of delivering a conclusion on the error type of an existing error, but employs different input variables (measured values or derived values) and/or algorithms for this purpose. The results of evaluations of the various protection criteria S1 . . . Sn are expressed in the form of the protection criteria-specific probability values $W_k1 \ldots W_kn$, which respectively indicate the probability of the presence of an error type, subject to the protection criterion evaluated. Thereafter, protection criteria-specific probability values are multiplied by appropriate weighting factors G1 . . . Gn, for the purposes of the prioritization of individual protection criteria S1 . . . Sn. In this manner, a heavier weighting can deliberately be assigned to results for individual protection criteria, in relation to results for other protection criteria. If no prioritization is to be applied, this weighting can be omitted, or identical weighting factors G1 . . . Gn can be applied to all protection criteria. In general, it is preferred that weighting factors are selected such that the sum thereof is equal to 1; however, the selection of other weighting factors is also possible.

The weighted protection criteria-specific probability values $W_k1 \ldots W_kn$ are then routed to a summation unit 20 which determines the sum of the individual protection criteria-specific probability values $W_k1 \ldots W_kn$ by the constitution of an overall result in the form of a loop-specific probability value $W_s(L1E)$ which indicates the probability of the presence of an error type in the loop considered.

The procedure described for exemplary purposes with respect to the loop L1E also applies to all the other potential loops in which an error can occur, i.e. the loops L2E, L3E, L12, L23, L31, L123, as represented in FIG. 2 by the plurality of planes in the sequence block circuit diagram. For each loop, in the manner described, a loop-specific probability value $W_s(L1E) \ldots W_s(L123)$ is determined and delivered. In a down-circuit combination unit 21, the respective loop-specific probability values are combined and evaluated. Finally, in consideration of all the loop-specific probability values $W_s(L1E) \ldots W_s(L123)$, the error signal F indicating the error type is constituted. The error signal F thus generated in consideration of all the loop-specific probability values (and thus in consideration of all the protection criteria-specific probability values for all the loops) indicates the error type thus determined such that, in consideration of this error signal, any requisite trip signal A for a switch can be generated.

Figure 3:
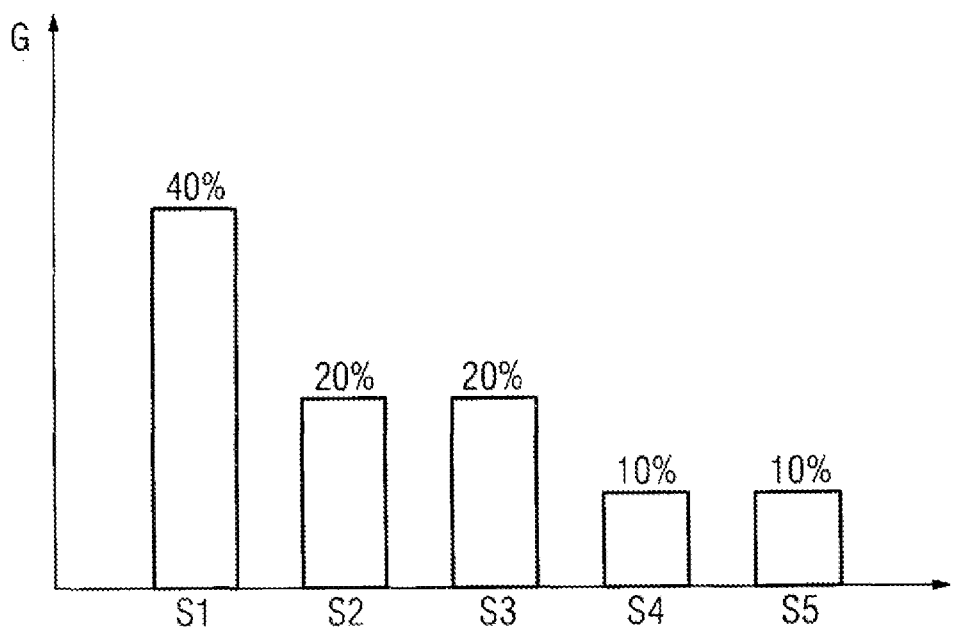
FIGS. 3, 4 show diagrams for the clarification of the application of weighting factors.
Figure 4:
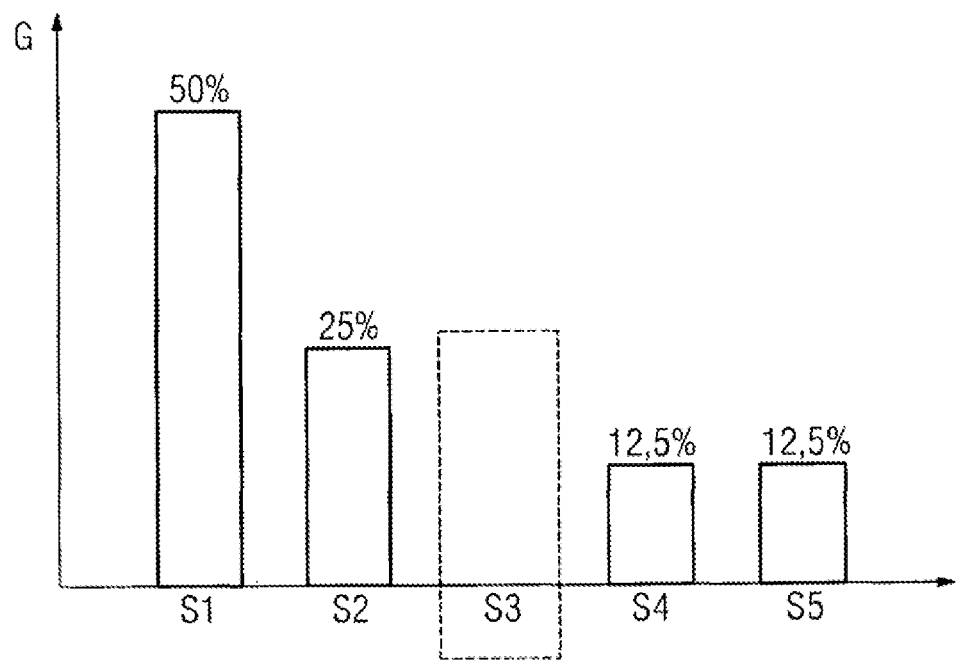

If, for the application of a specific protection criterion S1 . . . Sn, the requisite measured values and/or derived values are not available, it is possible to temporarily exclude the protection criterion in question from the evaluation. Missing measured values and/or derived values can occur, for example, where saved values are not (yet) available, in the absence of the detection of measured values or, in general, in the event of the absence of measuring channels. Verification to this effect is executed in the up-circuit precondition check units V1 . . . Vn for the protection criteria S1 . . . Sn. If, in such a precondition check unit V1 . . . Vn, it is established that the requisite measured values and/or derived values for the execution of the protection criterion are not available, the latter is temporarily deactivated, until such time as the requisite measured values and/or derived values are available once more. Moreover, the weighting factors G1 . . . Gn can be adjusted to the protection criteria actually applied such that the sum thereof, even in the absence of the weighting factor for the deactivated protection criterion, is restored to the value of 1. This is illustrated in an exemplary manner in FIGS. 3 and 4. Herein, in diagrammatic form, the weighting factors are represented for five exemplary protection criteria S1 . . . S5, in case of the evaluation of all protection criteria (FIG. 3) and after the deactivation of protection criterion S3 (FIG. 4) on the grounds of the absence of the requisite measured values and/or derived values. The respective values of weighting factors are indicated in the diagram. Under normal circumstances, where all the protection criteria are applied, all the weighting factors assume values greater than zero. In the event that one protection criterion (in this case S3) is not applied, the weighting factor thereof is set to 0%, and the value of the missing weighting factor (in this case 20%) is divided between the remaining weighting factors, in accordance with their respective weighting, such that the sum of all the remaining weighting factors is restored to 1. By the adjustment of weighting factors, it is achieved that a deactivated criterion does not influence the overall result.

The weighting factors can be predefined as a fixed value and derived, for example, from values obtained in the field for similar network configurations. However, the weighting factors can also be selected in consideration of the respective specific network configuration, or even dynamically adjusted to changing network conditions including e.g. a high/low infeed, load conditions or variations in network topology.

The procedure represented in FIG. 2 is described in greater detail hereinafter with reference to the example of the "defective loop" error type. In this case, the respective individual protection criteria S1 . . . Sn are appropriate per se for the establishment of whether the loop considered is affected by an error. The procedure for the potential loop S1 is represented first.

Figure 5:
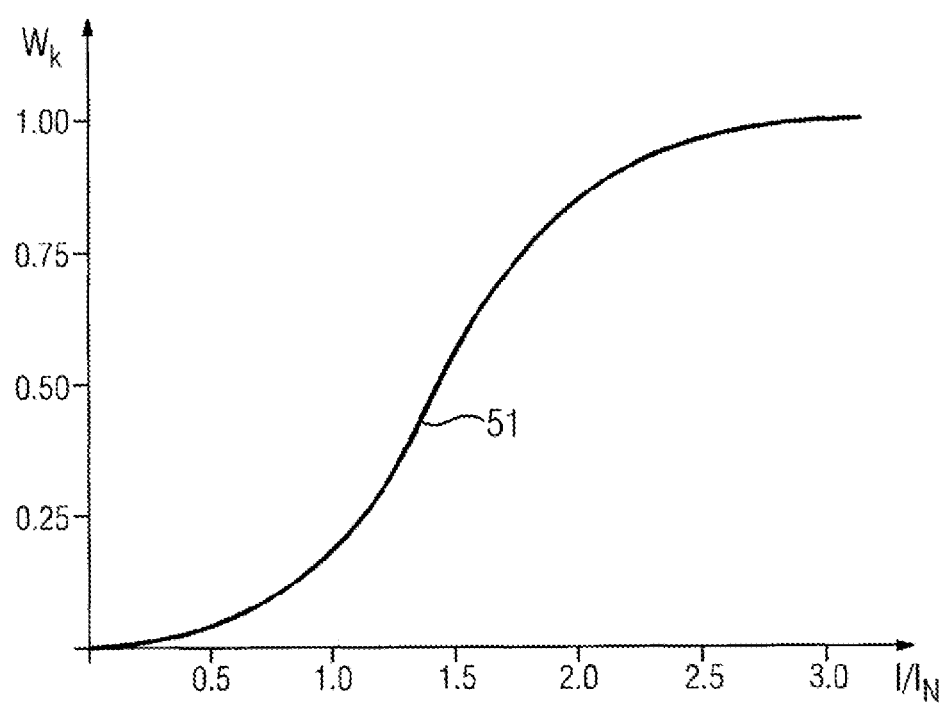
FIGS. 5-8 show diagrams for the clarification of the determination of protection criteria-specific probability values for the "defective loop" error type.

For example, the first protection criterion S1 can be a current level criterion, which considers the magnitude of the present measured current I (as a RMS value related to the rated current $I_N$). A high current indicates an error affecting the loop thus checked. FIG. 5 shows an exemplary diagram with a characteristic curve 51. This figure shows how the first protection criterion S1, from the current level $I/I_N$, determines the level of a protection criteria-specific probability value $W_k1$. It will be seen that, as the current $I/I_N$ increases, the probability that the loop in question is involved in an error likewise increases until, at a significant current level (in this case, where I is of the order of $3*I_N$), it reaches a value of 1. The protection criteria-specific probability value $W_k1$ determined in accordance with the characteristic curve 51 in the diagram is delivered by the unit S1 (cf. FIG. 2), is multiplied by the weighting factor G1 and is routed to the summation unit 20.

Figure 6:
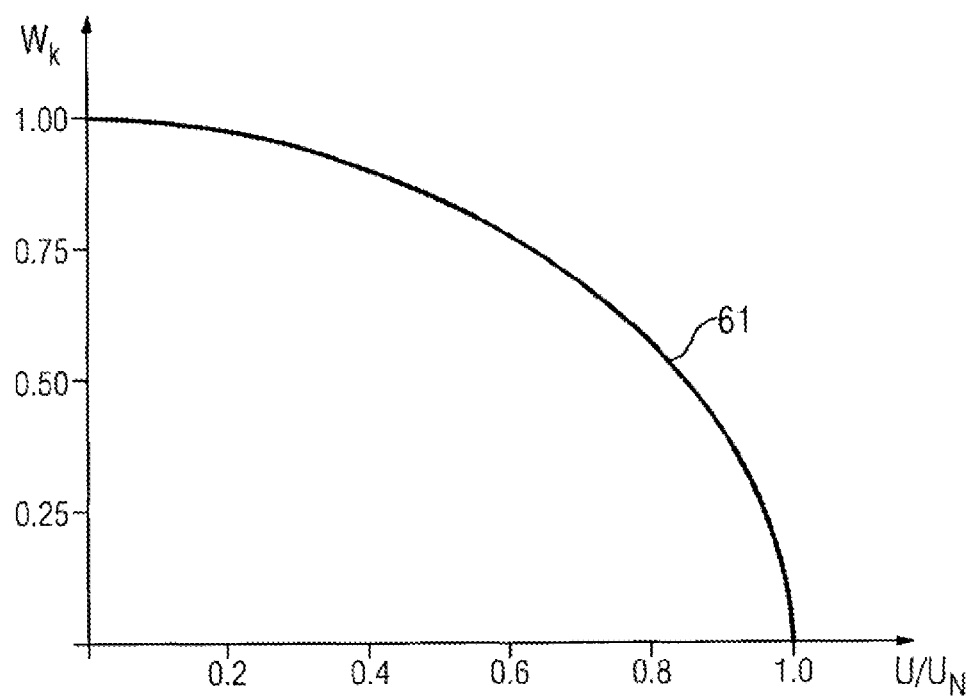

The second protection criterion S2 can, for example, be a voltage level criterion, which considers the magnitude of the present measured voltage U (as a RMS value related to the rated voltage $U_N$). A low voltage indicates an error in the loop thus checked. FIG. 6 shows an exemplary diagram with a characteristic curve 61. This figure shows how the second protection criterion S2, from the voltage level $U/U_N$, determines the level of the protection criteria-specific probability value $W_k2$. It will be seen that, as the voltage $U/U_N$ decreases, the probability that the loop in question is involved in an error increases until, at a very low voltage, it ultimately reaches a value of 1. The protection criteria-specific probability value $W_k2$ determined in accordance with the characteristic curve 61 in the diagram is delivered by the unit S2, is multiplied by the weighting factor G2 and is routed to the summation unit 20.

Figure 7:
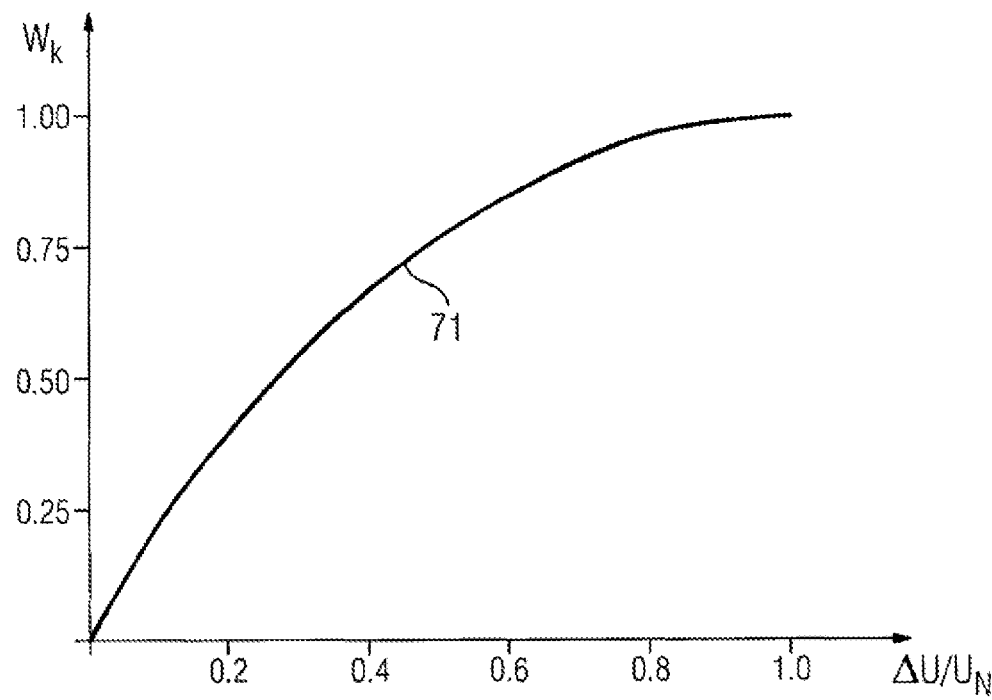

As a third protection criterion S3 (not represented in FIG. 2), for example, a delta voltage level criterion can be applied. This protection criterion involves delta variables for voltages. Large delta variables indicate significant steps in the voltage characteristic of the loop considered, and thus indicate a potential error. In this method, the delta voltage $\Delta U$ is considered relative to the rated voltage $U_N$. To this end, FIG. 7 shows a diagram with a characteristic curve 71. This shows how the third protection criterion S3, from the level of the delta voltage $\Delta U/UN$, determines the level of the protection criteria-specific probability value $W_k3$. It will be seen that, as the delta voltage $\Delta U/U_N$ increases, the probability that the loop in question is involved in an error increases, until it ultimately reaches a value of 1. The protection criteria-specific probability value $W_k3$ determined in accordance with the characteristic curve 71 in the diagram is multiplied by a weighting factor G3 (not represented in FIG. 2) and routed to the summation unit 20.

Figure 8:
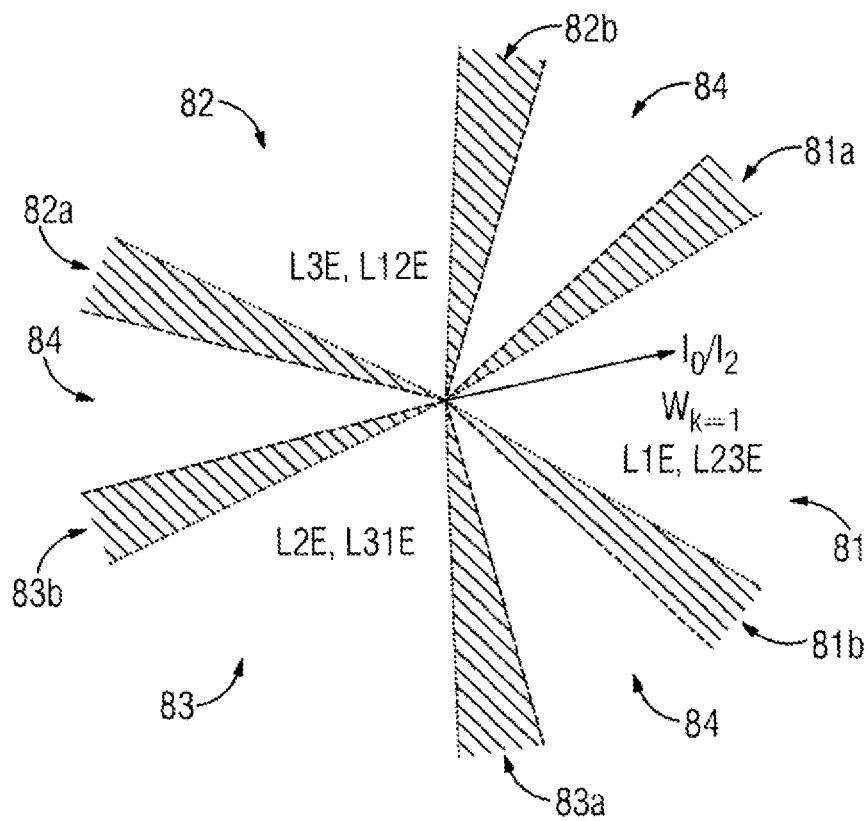

As a final protection criterion Sn, for example, a symmetrical component criterion can be applied. This protection criterion is based upon symmetrical components, in which the relationship between the zero, negative and positive phase-sequence indices for current or voltage is considered. FIG. 8 shows an exemplary diagram, in which the relationship between index variables for the zero phase-sequence current and the negative phase-sequence current can be plotted. Essentially, three regions 81, 82, 83 can be identified in which, by the respective application of the symmetrical component criterion, the presence of an error in the respectively selected loop can be determined with a probability of 1. At the boundaries of the respective regions 81-83, transition regions 81a,b, 82a,b, 83a,b are formed, in which the probability of involvement of the respective loop in a fault declines from 1 to 0. In the intervening regions 84, the symmetrical component criterion in each case identifies a probability of 0 for the respective loop considered such that, in this case, no clear selection can be achieved by the application of the symmetrical component criterion. This underlines the importance of the fact that multiple protection criteria are involved in the evaluation of error type, and that the results of evaluations of all protection criteria are considered in the determination of error type.

In the case represented in FIG. 8, wherein the index 80 indicating the ratio of the zero phase-sequence current $I_0$ to the negative phase-sequence current $I_2$ lies within the region 81, it can be established that a protection criteria-specific probability value of 1 is assigned respectively to the potential loops L1E and L23 (with a ground fault involvement). The correspondingly determined protection criteria-specific probability value $W_k n$ is multiplied by a weighting factor Gn, and is routed to the summation unit 20.

Other potential protection criteria can include e.g. a delta current level criterion, an impedance criterion or a step detection criterion. The application of other appropriate protection criteria is naturally possible, such that the protection device can always be adapted to conditions dictated by the topology and configuration of the monitored energy supply network, by the selection of appropriate protection criteria.

The weighted protection criteria-specific probability values $W_k 1 \ldots W_k n$, as described above, are routed to the summation unit 20 which, by addition, constitutes the loop-specific probability value $W_s(L1E)$ for the loop L1E.

In a corresponding manner, loop-specific probability values $W_s(L2E) \ldots W_s(L123)$ are constituted for the remaining loops by the application of the same, or of other appropriate protection criteria. All the loop-specific probability values $W_s(L1E) \ldots W_s(L123)$ are evaluated in the combination unit 21, and are considered in the generation of the error signal F which indicates the "defective loop" error type. To this end, the combination unit can, for example, select those loops which show the highest loop-specific probability value as those which are affected by a fault. In order to provide sufficient protection against spurious tripping, it can further be provided that an error signal F is only generated if the largest loop-specific probability value exceeds a fault detection threshold value. This threshold value can either be predefined as a fixed value, or can be adjusted to the respective loop-specific probability values (e.g. the relative magnitude of one loop-specific probability value in comparison with all the other loop-specific probability values, the margin between the largest loop-specific probability value and the second largest loop-specific probability value, etc.).

The error signal F generated, in consideration of all the loop-specific probability values (and thus in consideration of all the protection criteria-specific probability values for all the loops), indicates the error type thus determined. In the event of the likewise described "defective loop" error type, the error signal consequently indicates the loop which is affected by the error such that, in consideration of this error signal, any requisite trip signal A can be generated for a switch.

Figure 9:
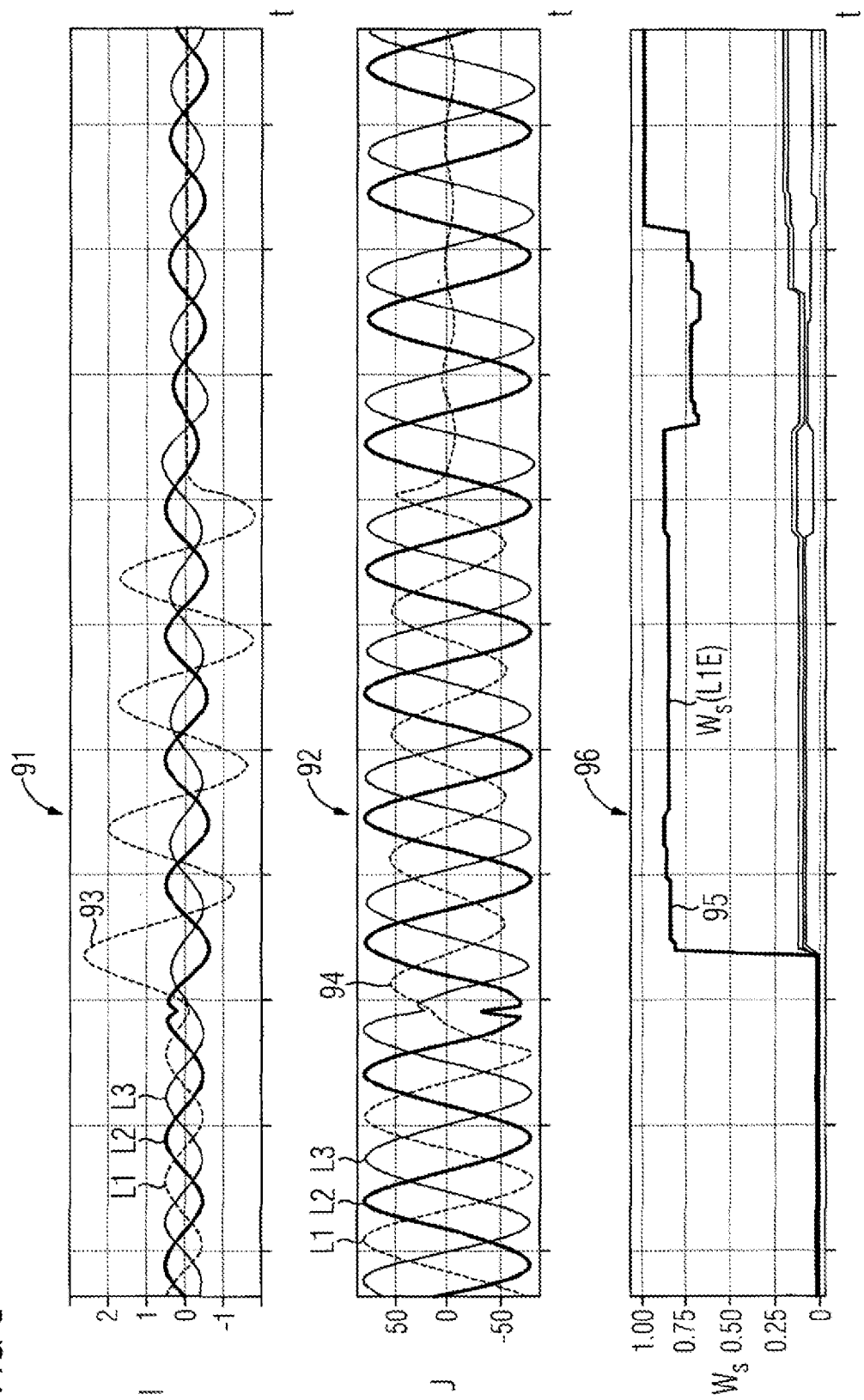
FIGS. 9-11 show measured value characteristics and diagrams for the clarification of the generation of an error signal for the "defective loop" error type.
Figure 10:
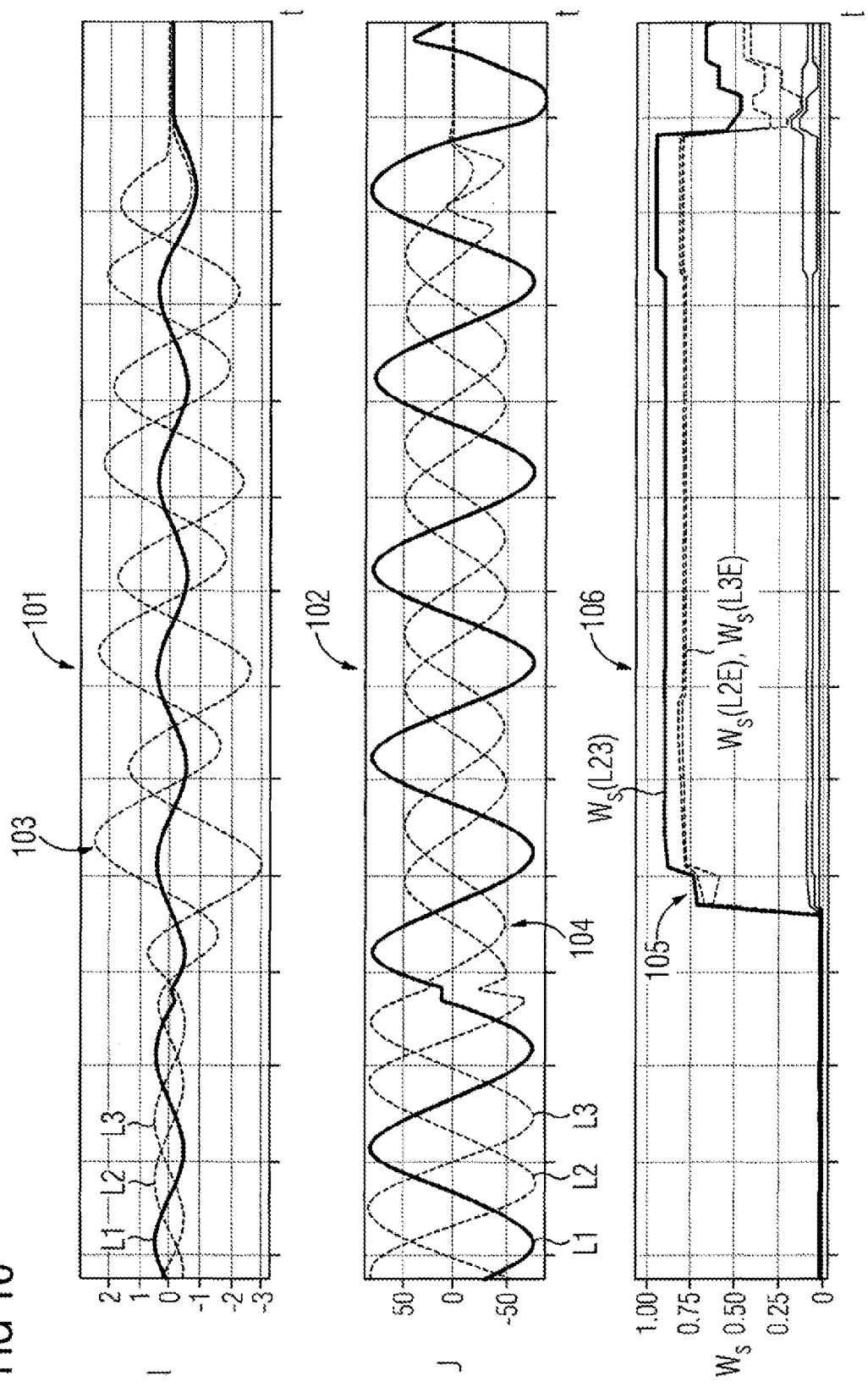
Figure 11:
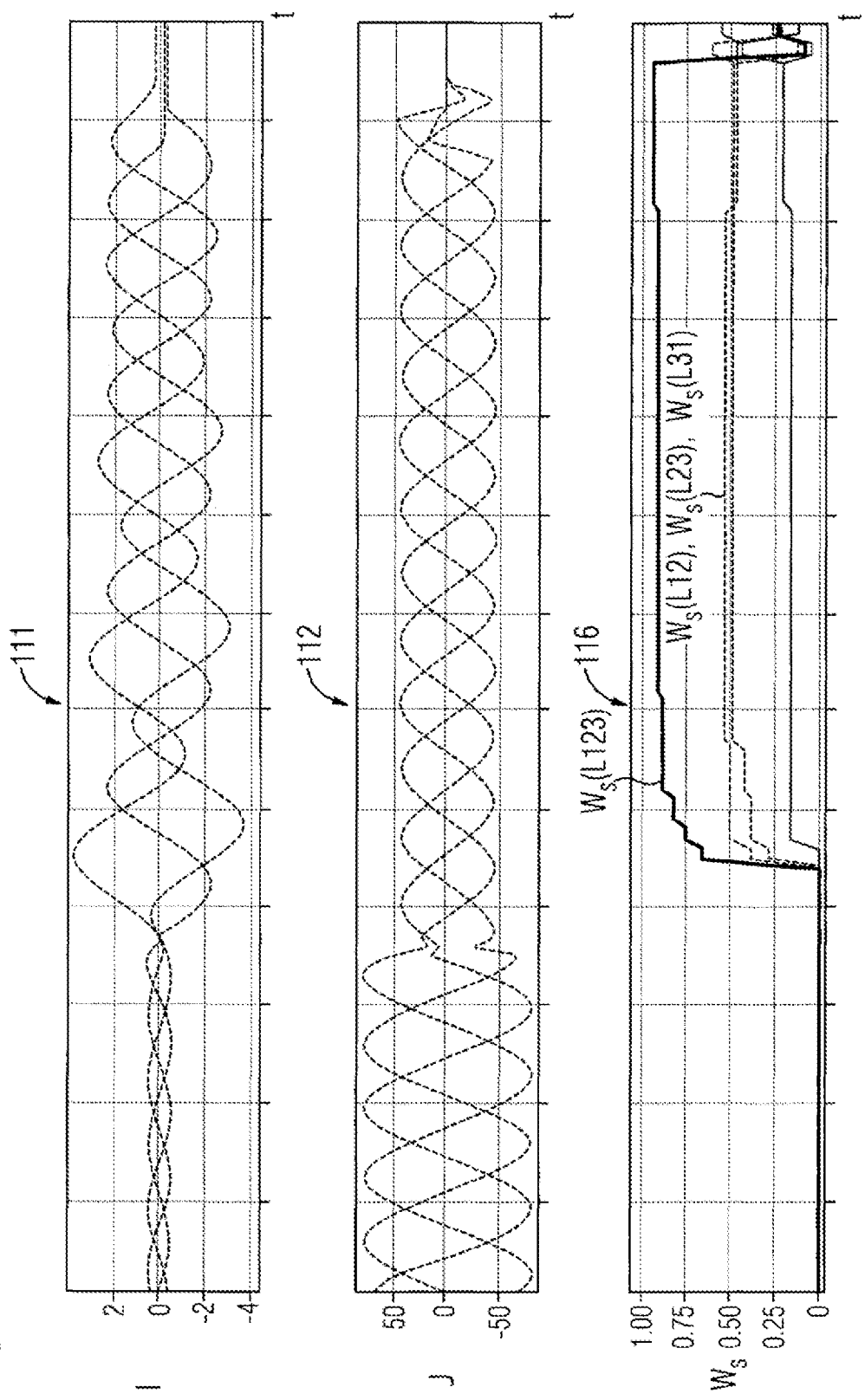

FIGS. 9-11 show diagrams for different error scenarios wherein, by the application of the aforementioned method, a defective loop can be identified.

FIG. 9 represents typical time characteristics for currents (diagram 91) and voltages (diagram 92) during a single-pole error (L1E). Diagram 96 shows the characteristic of loop-specific probability values $W_s$ for all the potential loops. The current on the defective phase rises (point 93 in the diagram 91). Conversely, the voltage on the defective phase collapses (point 94 in the diagram 92). By the application of the various protection criteria (e.g. the current level criterion, voltage level criterion, delta current level criterion, delta voltage level criterion, impedance criterion, etc.), protection criteria-specific probability values for the individual potential loops can be determined, from which, in turn, a respective loop-specific probability value can be determined. The algorithm for the detection of the "defective loop" error type responds rapidly and, within a short time interval, in consideration of all the protection criteria-specific probability values, identifies the defective loop L1E (point 95 in diagram 96), which shows a loop-specific probability value in excess of 85%. The value for the remaining loops is generally below 10%.

FIG. 10 represents typical time characteristics for currents (diagram 101) and voltages (diagram 102) during a two-pole error involving a ground fault (L23, with a ground fault). Diagram 106 shows the characteristic of loop-specific probability values $W_s$ for all the potential loops. Upon the occurrence of an error, the current on the affected phases rises (point 103 in diagram 101), whereas the voltage on the affected phases falls (point 104 in diagram 102). By the application of the various protection criteria, protection criteria-specific probability values can be determined for the individual potential loops from which, in turn, a respective loop-specific probability value is determined. Again in this case, the algorithm for the detection of the "defective loop" error type responds rapidly and reliably. Three loops (L23, L2E, L3E) are identified with loop-specific probability values to a quality in excess of 75% (point 105 in diagram 106) which, for this error type, is the correct response.

FIG. 11 represents typical time characteristics for currents (diagram 111) and voltages (diagram 112) during a three-pole error (L123). Diagram 116 shows the characteristic of the loop-specific probability values $W_s$ for all the potential loops. In this case, a higher loop-specific probability value $W_s(L123)$ is calculated for the three-pole loop L123. As a three-pole error is involved, the loop-specific probability values for the two-pole loops $W_s(L12)$, $W_s(L23)$, $W_s(L31)$ are also relatively high. Conversely, the value determined for single-pole loops is lower.

The sequence block circuit diagram represented in FIG. 2 shows the general procedure for the generation of an error signal indicating an error type. In the case of the "error direction" error type, however, it must be specifically considered that the respective protection criterion can deliver a total of three results (for forward, backward, or non-directional probability) whereas, for the "defective loop" error type, only one result (probability of error in the affected loop) is determined in each case. Consequently, in consideration of FIG. 12, which represents the specific case of the "error direction" error type according to FIG. 2, the generation of an error signal indicating the error direction of an error will be clarified. However, as the general statements set out with respect to FIG. 2 are also valid for the "error direction" error type, the description of FIG. 12 hereinafter essentially focuses upon the particular features of the determination of this error type.

Figure 12:
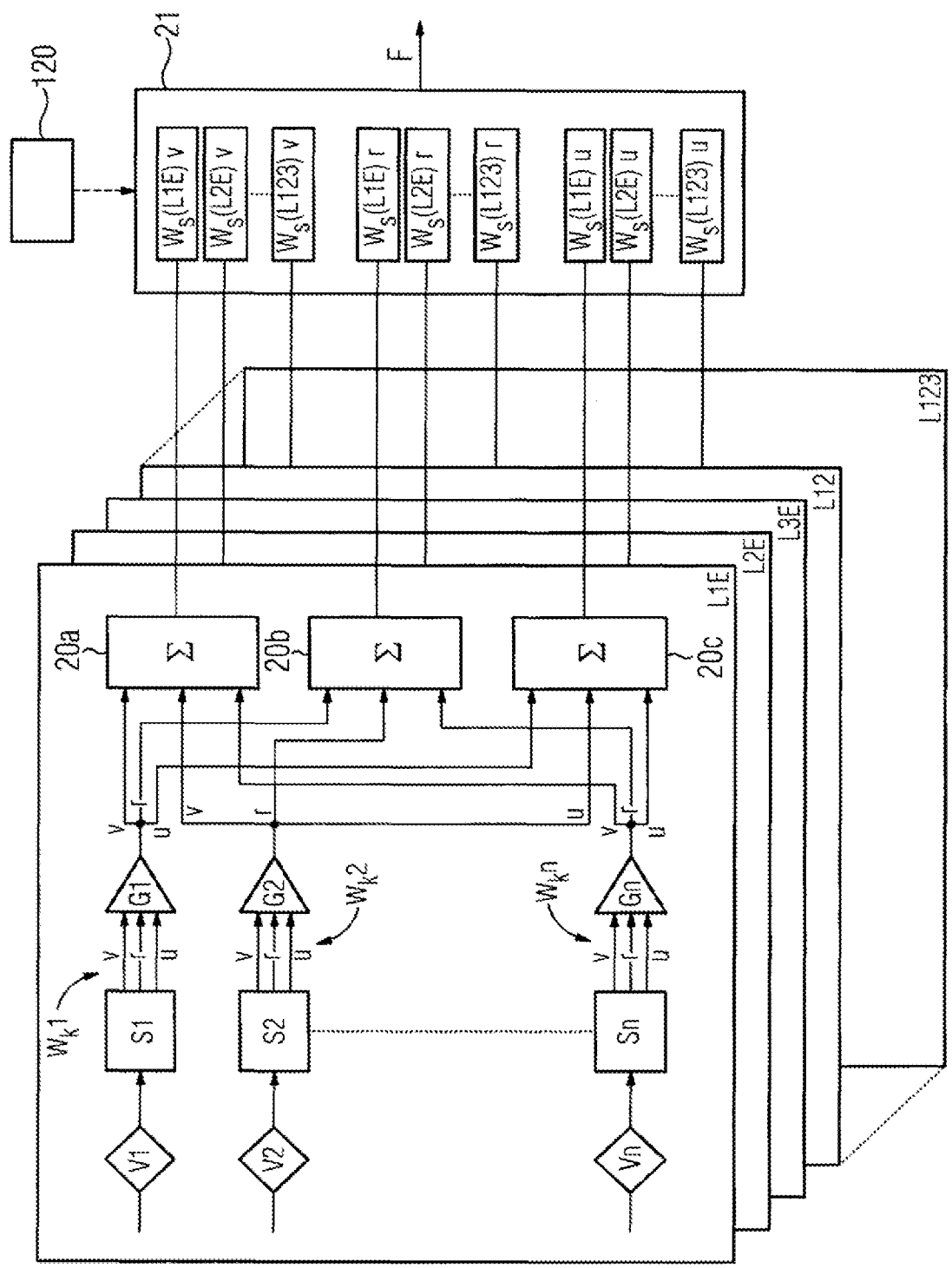
FIG. 12 shows a schematic sequence block circuit diagram for the clarification of the generation of an error signal for the "error direction" error type.

In the form of a sequence block circuit diagram based upon the representation shown in FIG. 2, FIG. 12 represents an exemplary function executed by the evaluation device 14 (cf. FIG. 1) for the determination of the "error direction" error type of an error, and for the generation of an error signal F indicating the error type thus determined. Detection of the error type is executed for all the potential loops in which an error can occur, i.e. L1E, L2E, L3E, L12, L23, L31, L123. The following comments relate primarily to the potential loop L1E.

For the determination of the "error direction" error type of an error according to the sequence block circuit diagram represented in FIG. 12, a plurality of different protection criteria S1, S2, . . . Sn are also mutually evaluated in parallel. Each protection criterion is, in itself, independently capable of delivering a conclusion on the "error direction" error type of an existing error, but employs different input variables (measured values or derived values) and/or algorithms for this purpose. The results of evaluations of the various protection criteria S1 . . . Sn are expressed in the form of protection criteria-specific probability values $W_k1 \ldots W_kn$, which respectively indicate the probability of the presence of an error type, subject to the protection criterion evaluated. In this case, it must be specifically considered that each protection criterion S1 . . . Sn, on the grounds of the potential error directions:

v: "forward",
r: "backward",
u: "non-directional" (non-directional signifies that the error direction cannot be clearly determined)

can generate up to three different results in each case. In this regard it can be provided, for example, that the protection criteria S1 . . . Sn opt for one of these results, such that only a single protection criteria-specific probability value is delivered. For example, in this case, protection criterion S1 could deliver a single protection criteria-specific probability value $W_k1\_v$ for the forward direction, whereas no protection-criteria-specific probability values $W_k1\_r$ and $W_k1\_u$ are delivered for the reverse direction or the non-directional case.

Alternatively, however, it can also be provided that the protection criteria deliver a protection criteria-specific probability value for each of the three cases. In this case, the sum of these protection criteria-specific probability values is preferably 1, wherein one or two of the values can also be 0. By the indication of up to three protection criteria-specific probability values, borderline cases, in which no clear distinction can be drawn between individual directions, or between one direction and a non-directional case, can also be transparently identified and incorporated in the constitution of the error signal.

Each protection criterion S1 . . . Sn thus delivers up to three protection criteria-specific probability values $W_k1\_v \ldots W_kn\_v, W_k1\_r \ldots W_kn\_r$ and $W_k1\_u \ldots W_kn\_u$. Thereafter, protection criteria-specific probability values are again multiplied by appropriate weighting factors G1 . . . Gn, for the purposes of the prioritization of the individual protection criteria S1 . . . Sn. For details of the weighting factors G1 . . . Gn, the reader is referred to the comments set out with respect to FIG. 2.

The weighted protection criteria-specific probability values $W_k1\_v \ldots W_kn\_v, W_k1\_r \ldots W_kn\_r$ and $W_k1\_u \ldots W_kn\_u$ are then each routed to a summation unit 20a-c for the respective error direction where, in each case, the sum of the individual protection criteria-specific probability values $W_k1\_v \ldots W_kn\_v, W_k1\_r \ldots W_kn\_r$ and $W_k1\_u \ldots W_kn\_u$ for the respective error direction is determined for the constitution in each case of an overall result in the form of a loop-specific probability value for the respective error direction $W_s(L1E)$ v, $W_s(L1E)$ r, $W_s(L1E)$ u in each case. The respective loop-specific probability value indicates the probability of the presence of the respective error direction in the loop considered.

The procedure described for exemplary purposes with respect to the loop L1E, as already described with reference to FIG. 2 also applies to all the other potential loops in which an error can occur. For each loop, in the manner described, a loop-specific probability value $W_s(L1E)\_v \ldots W_s(L123)\_v, W_s(L1E)\_v \ldots W_s(L123)\_r, W_s(L1E)\_v \ldots W_s(L123)\_u$ is determined and delivered in each case. In the down-circuit combination unit 21, the respective loop-specific probability values are combined and evaluated. Finally, in consideration of all the loop-specific probability values $W_s(L1E)\_v \ldots W_s(L123)\_v, W_s(L1E)\_v \ldots W_s(L123)\_r, W_s(L1E)\_v \ldots W_s(L123)\_u$, the error signal F indicating the error direction is constituted. The error signal F thus generated in consideration of all the loop-specific probability values (and thus in consideration of all the protection criteria-specific probability values for all the loops) indicates the error type thus determined such that, in consideration of this error signal, any requisite trip signal A for a switch can be generated.

In the case of the "error direction" error type, the constitution of the error signal can be based exclusively upon available loop-specific probability values for the "error direction" error type. Herein, for example, a loop-specific probability value of a significantly high magnitude which, in comparison with the other loop-specific probability values, clearly indicates a specific error direction in a specific loop, can be selected for the constitution of the error signal. However, the error signal for the "error direction" error type can also operate in combination with another algorithm 120, which determines the "defective loop" error type. From this algorithm, the combination unit 21 receives information on the defective loop, and additionally considers said information in the constitution of the error signal such that, for the defective loop identified by means of information delivered by the algorithm 120, the loop-specific probability values for the "error direction" error type in the loop at issue are mutually compared. The error direction which is indicated by the loop-specific probability value with the greatest magnitude is selected as the actual error direction for the loop at issue, and is employed to constitute the error signal F. The algorithm 120 for the determination of the "defective loop" error type can function, for example, as described above with reference to FIG. 2; however, it can also be implemented in another manner.

In order to provide sufficient protection against spurious tripping, it can again be provided that the error signal F is only generated if the largest loop-specific probability value exceeds a fault detection threshold value. This threshold value can either be predefined as a fixed value, or can be adjusted to the respective loop-specific probability values.

If, for the application of a specific protection criterion S1 . . . Sn, the requisite measured values and/or derived values are not available, it is also possible to temporarily exclude the protection criterion in question from the evaluation, in case of the determination of the "error direction" error type. Verification to this effect is again executed in the up-circuit precondition check units V1 . . . Vn for the protection criteria S1 . . . Sn. If, in such a precondition check unit V1 . . . Vn, it is established that the requisite measured values and/or derived values for the execution of the protection criterion are not available, the latter is temporarily deactivated, until such time as the requisite measured values and/or derived values are available once more. Again, moreover, the weighting factors G1 ... Gn can be adjusted to the protection criteria actually applied (see comments with regard to FIG. 2).

Figure 13:
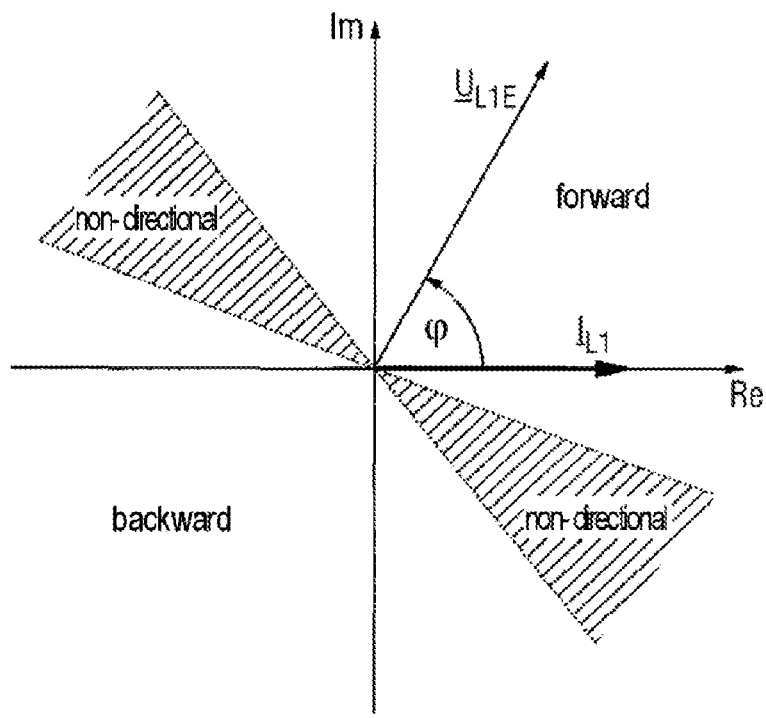
FIGS. 13-16 show diagrams for the clarification of the determination of protection criteria-specific probability values for the "error direction" error type.
Figure 14:
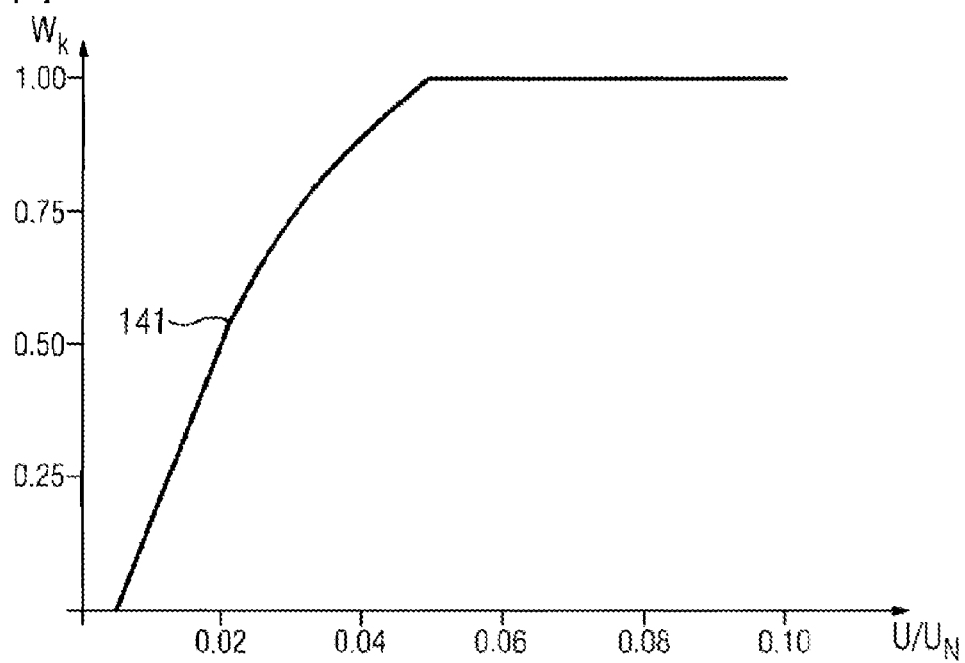

For example, as the first protection criterion S1 for the determination of error direction, the actual present short-circuit voltage can be employed. This protection criterion defines the ratio of the present voltage index to the present current index (see FIG. 13). The calculated angle φ between the two indices indicates the error direction; in the present case, a forward direction is detectable. FIG. 14 represents an exemplary diagram with a characteristic curve 141. This shows how the first protection criterion S1, from the voltage level $U/U_N$, determines the level of a protection criteria-specific probability value $W_k1$ for the respective error direction determined from the angle (cf. diagram 13). It will be seen that, as the voltage $U/U_N$ rises, the probability of the presence of the error direction derived from the angle in the loop thus checked likewise increases. The protection criteria-specific probability value $W_k1$ for the respective error direction determined in accordance with the characteristic curve 141 in the diagram is delivered by the unit S1 (cf. FIG. 12), is multiplied by the weighting factor G1 and is routed to the summation units 20a-c.

Figure 15:
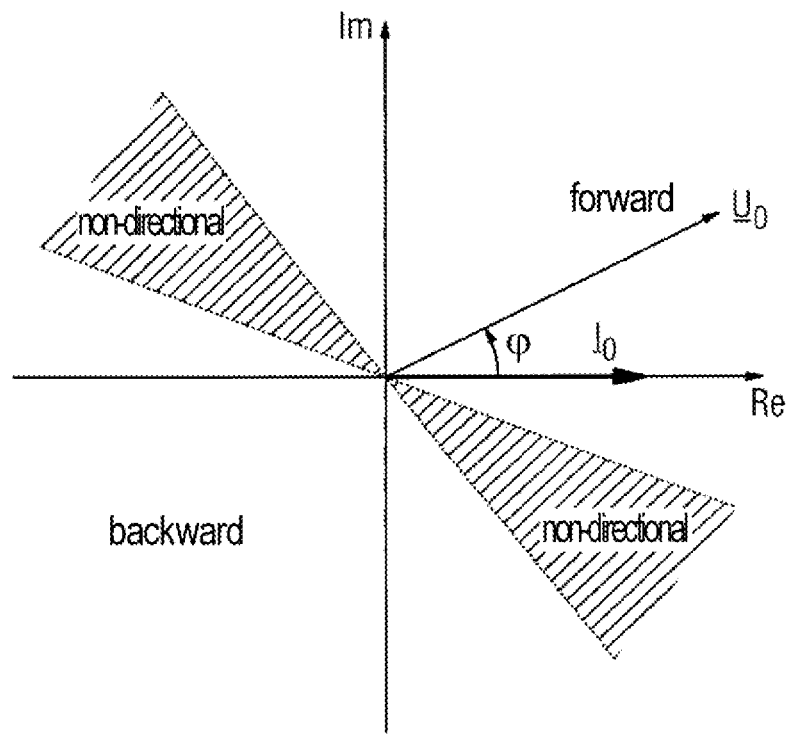
Figure 16:
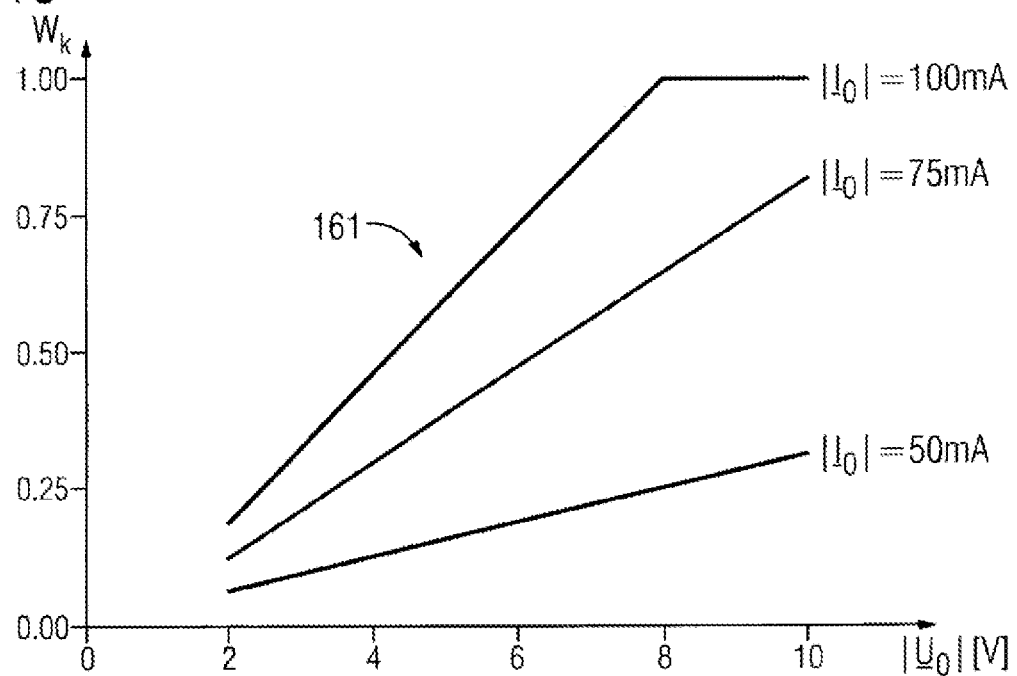

As a second protection criterion S2 for determining the "error direction" error type, for example, a symmetrical component criterion can be used. Directional determination is based upon symmetrical components. In directional determination using zero phase-sequence variables, the angle φ between the voltage and current indices for the zero phase-sequence system is determined (see FIG. 15). The calculated angle indicates the error direction; in the present case, a forward direction is indicated. The method only works for errors involving a ground fault. FIG. 16 shows an exemplary diagram with a characteristic curve series 161 for various zero phase-sequence currents which, in relation to the zero phase-sequence voltage, permit the determination of the associated protection criteria-specific probability value $W_k$ for the error direction detected with reference to the angle. The protection criteria-specific probability value $W_k1$ determined according to the characteristic curve series 161 in the diagram for the respective error direction detected according to the angle (see FIG. 15) is delivered by unit S2, multiplied by the weighting factor G2 and routed to the summation units 20a-c.

Other potential protection criteria including, e.g. an actual saved short-circuit voltage, an externally-generated present short-circuit voltage, or an externally-generated saved short-circuit voltage can be used; a delta variable criterion can also be employed. The application of other appropriate protection criteria is naturally also possible, such that the protection device can always be adapted to conditions dictated by the topology and configuration of the monitored energy supply network, by the selection of appropriate protection criteria.

The weighted protection criteria-specific probability values for the individual error directions, as described above, are routed to the summation units 20a-c which, by addition, constitute the respective loop-specific probability value for the respective error direction.

The error signal F thus generated in consideration of all the loop-specific probability values (and thus in consideration of all the protection criteria-specific probability values for all the loops) indicates the "error direction" error type thus determined such that, in consideration of this error signal, any requisite trip signal A for a switch can be generated.

The respective error signals indicating the "defective loop" and "error direction" error types can, in each case per se, be employed as error signals for the generation of any requisite trip signal for a circuit-breaker. Particularly advantageously, however, an overall fault signal $F_G$ can also be generated, which is determined by the combination of error signals for the individual error types. This is indicated in FIG. 17. FIG. 17 shows a schematic sequence block circuit diagram in which, by means of a first algorithm 171, a first error signal $F_1$ is generated which, as an error type, indicates an error direction. The first algorithm 171 can operate, for example, according to the descriptions set out with respect to FIGS. 2 and 12. By means of a second algorithm 172, a second error signal $F_2$ is generated which, as an error type, indicates a defective loop. The second algorithm 172 can operate, for example, according to the descriptions set out with respect to FIG. 2. As indicated by a dashed arrow, the second algorithm 172 can also transmit information regarding a defective loop identified to the first algorithm; as described with reference to FIG. 12, this information can be used by the first algorithm 171 to generate the first error signal $F_1$. In consideration of the two error signals $F_1$ and $F_2$, an overall fault signal $F_G$ can be generated, which indicates the defective loop and the error direction in the loop at issue. To this end, for example, the error signals $F_1$ and $F_2$ can be interconnected by means of an AND element 174.

It can further be provided that, by means of a third algorithm 173, an error zone signal $F_3$ can be generated, if an error lies within the protection zone which is monitored by the protection device. The third algorithm can be, for example, a distance protection algorithm which, by the application of impedance indices, determines the presence of an error in a protection zone which is monitored by the protection device. However, the third algorithm can also be any other arbitrary protection algorithm, e.g. an overcurrent-time protection algorithm. The overall error signal $F_G$ can then be generated in additional consideration of the error zone signal $F_3$; to this end, for example, all the error signals $F_1$-$F_3$ can be mutually combined by means of the AND element 174.

While the procedure described is executed for each loop, the overall error signal $F_G$ ultimately indicates only the actual loop which is affected by the error in the protection zone, and the error direction thereof.

By the application of the overall error signal $F_G$, a trip signal can be generated for the actuation of a circuit-breaker for the disconnection of the error.

An algorithm was described above, by means of which an error signal indicating an error type can be generated in a particularly advantageous manner. A specific advantage is provided in that, for the identification of an error type, a plurality of protection criteria are evaluated in parallel, and the results of all evaluations are incorporated in the generation of the error signal. The algorithm described can be adapted to new network conditions and network configurations in a highly flexible manner. The protection criteria which assume a significant role in a first energy supply network do not necessarily have the same significance with regard to the state of another energy supply network. By the selection of appropriate protection criteria, the algorithm can be adapted to the respective energy supply network in a highly flexible manner. Moreover, an offset can be applied to the weighting of individual protection criteria, in accordance with the network design. In the light of the increasing occurrence of bidirectional energy transmission in energy supply networks, both the network configuration and the short-circuit capacity of the network undergo more frequent changes. The algorithm described constitutes a forward-looking smart grid application. It delivers improved stability in loop selection and directional detection, thus providing the basis for the correct operation of any protection algorithm, e.g. a distance protection algorithm.

The invention claimed is:

1. A method of generating an error signal indicating an error type of an error in a multi-phase electrical energy supply network, the method comprising:
  acquiring measured values at at least one measurement point in the energy supply network, the measured values describing a current operating state of the energy supply network;
  transmitting the measured values to a protection device, the protection device having an evaluation device;
  using the measured values in the evaluation device to evaluate each potential loop of the energy supply network that may be affected by an error with respect to a recognition of the error type of the error, wherein the error type of the error is selected from the group consisting of an error direction and a defective loop; and
  for each potential loop, evaluating the measured values and/or values derived from the measured values by applying at least two different protection criteria, wherein each of the at least two protection criteria is capable of independently identifying the same error type of the error present in the respective loop thus evaluated; and
  if an error is present, generating the error signal in consideration of all available results for the evaluation of the protection criteria.

2. The method according to claim 1, which comprises evaluating the protection criteria in parallel.

3. The method according to claim 1, which comprises:
  multiplying a result of the evaluation of the respective protection criterion by a weighting factor to form a weighted result; and
  for each potential loop, combining all the weighted results to form an overall result.

4. The method according to claim 3, which comprises generating the error signal in consideration of the overall results for all the loops evaluated.

5. The method according to claim 3, which comprises, for each potential loop, selecting the weighting factors applied for all the protection criteria thus evaluated such that a sum thereof is equal to 1.

6. The method according to claim 3, which comprises selecting a magnitude of the respective weighting factors in accordance with a respective configuration of the energy supply network.

7. The method according to claim 3, which comprises generating the error signal only if the overall result for at least one potential loop exceeds an error detection threshold value.

8. The method according to claim 3, wherein:
  the respective result of evaluation of the respective protection criterion is a protection criteria-specific probability value, which indicates a probability, according to the protection criteria evaluated, of a presence of an error of a relevant error type; and
  the respective overall result is a loop-specific probability value, which indicates a probability of a presence of an error of the relevant error type in the loop considered.

9. The method according to claim 3, which comprises:
  evaluating a respective protection criterion only if all the measured values and/or derived values required for the evaluation thereof are available; and
  establishing the overall result only by applying the weighted results of those protection criteria which have been evaluated.

10. The method according to claim 1, which comprises evaluating a respective protection criterion only if all measured values and/or derived values required for the evaluation of the respective protection criterion are available.

11. The method according to claim 1, wherein the error signal indicates a direction of an error as an error type.

12. The method according to claim 1, wherein the error signal indicates a defective loop as an error type.

13. The method according to claim 1, which comprises:
  generating a first error signal which, as an error type, indicates a direction of an error;
  generating a second error signal which, as an error type, indicates a defective loop; and
  generating an overall error signal in consideration of the first and second error signals.

14. The method according to claim 13, which comprises:
  using the evaluation unit to verified whether an error is present in a protection zone of the energy supply network which is directly monitored by the protection device, and generating an error zone signal if an error is present in the protection zone; and
  generating the overall error signal also in consideration of the error zone signal.

15. A protection device for generating an error signal indicating an error type of an error in a multi-phase electrical energy supply network, the protection device comprising:
  a measured value detection device for detection of measured values at at least one measurement point in the energy supply network, wherein the measured values represent a current operating state of the energy supply network; and
  an evaluation device disposed to receive the measured values from said measured value detection device; and
  said evaluation device being configured to execute the method according to claim 1 by using the measured values to evaluate each potential loop of the energy supply network that can be affected by an error, with respect to a detection of an error type of an error and, in the event of the presence of an error, to generate the error signal.

16. A method of generating an error signal indicating an error type of an error in a multi-phase electrical energy supply network, the method comprising:
  acquiring measured values at at least one measurement point in the energy supply network, the measured values describing a current operating state of the energy supply network;
  transmitting the measured values to a protection device, the protection device having an evaluation device;
  using the measured values in the evaluation device to evaluate each potential loop of the energy supply network that may be affected by an error with respect to a recognition of the error type of the error, wherein the error type of the error is selected from the group consisting of an error direction and a defective loop; and
  for each potential loop, evaluating the measured values and/or values derived from the measured values by applying at least two different protection criteria, wherein each of the at least two protection criteria is capable of independently identifying the same error type of the error present in the respective loop thus evaluated;

multiplying a result of the evaluation of the respective protection criterion by a weighting factor to form a weighted result;

for each potential loop, combining all the weighted results to form an overall result; and if an error is present, generating the error signal in consideration of all available results for the evaluation of the protection criteria.

* * * * *